United States Patent
Kozlowski

(10) Patent No.: US 9,736,405 B2
(45) Date of Patent: Aug. 15, 2017

(54) GLOBAL SHUTTER IMAGE SENSOR HAVING EXTREMELY FINE PITCH

(71) Applicant: AltaSens, Inc., Westlake Village, CA (US)

(72) Inventor: Lester Joseph Kozlowski, Simi Valley, CA (US)

(73) Assignee: AltaSens, Inc., Westlake Village, CA (US)

( * ) Notice: Subject to any disclaimer, the term of this patent is extended or adjusted under 35 U.S.C. 154(b) by 190 days.

(21) Appl. No.: 14/608,329

(22) Filed: Jan. 29, 2015

(65) Prior Publication Data

US 2016/0227138 A1   Aug. 4, 2016

(51) Int. Cl.
| | |
|---|---|
| *H04N 5/335* | (2011.01) |
| *H04N 5/355* | (2011.01) |
| *H04N 5/353* | (2011.01) |
| *H04N 5/3745* | (2011.01) |
| *H01L 27/146* | (2006.01) |

(52) U.S. Cl.
CPC ..... *H04N 5/35563* (2013.01); *H01L 27/1463* (2013.01); *H01L 27/1464* (2013.01); *H01L 27/14609* (2013.01); *H01L 27/14634* (2013.01); *H04N 5/3532* (2013.01); *H04N 5/35572* (2013.01); *H04N 5/3745* (2013.01); *H01L 27/14627* (2013.01)

(58) Field of Classification Search
CPC ............. H04N 5/35563; H04N 5/3532; H04N 5/35572; H04N 5/3745; H04N 5/359; H01L 27/1463; H01L 27/14634; H01L 27/14609; H01L 27/1464; H01L 27/14627

USPC ............................... 348/294–297; 250/208.1
See application file for complete search history.

(56) References Cited

U.S. PATENT DOCUMENTS

| | | | |
|---|---|---|---|
| 5,083,016 A | 1/1992 | Wyles et al. | |
| 6,476,374 B1 | 11/2002 | Kozlowski et al. | |
| 7,768,569 B2 | 8/2010 | Kozlowski | |
| 8,637,800 B2 | 1/2014 | Kozlowski | |
| 2008/0007640 A1* | 1/2008 | Fuchikami | H04N 3/1512 348/301 |
| 2009/0201400 A1* | 8/2009 | Zhang | H01L 27/14609 348/296 |
| 2010/0309340 A1* | 12/2010 | Border | H04N 5/335 348/241 |

(Continued)

OTHER PUBLICATIONS

Stefan Lauxtermann, et al. "Comparison of Global Shutter Pixels for CMOS Image Sensors". Teledyne Imaging Sensors, 5212 Verdugo Way, Camarillo CA 93012, USA, 4 pages.

(Continued)

*Primary Examiner* — Sinh Tran
*Assistant Examiner* — Zhenzhen Wu
(74) *Attorney, Agent, or Firm* — Amin, Turocy & Watson LLP

(57) ABSTRACT

An image sensor having global shutter circuitry and an extremely fine pixel pitch. Disclosed image sensors combine global shutter circuitry with rolling shutter circuitry for respective subsets of sensor pixels to marry imaging benefits of global shutter circuitry with relatively small circuit overhead of rolling shutter circuitry. Such image sensors can achieve improved optical performance with smaller pixel pitch and optical resolution than existing global shutter image sensors.

20 Claims, 11 Drawing Sheets

(56) References Cited

U.S. PATENT DOCUMENTS

| | | | | |
|---|---|---|---|---|
| 2011/0096212 | A1* | 4/2011 | Oikawa | G03B 13/36 348/273 |
| 2011/0176043 | A1* | 7/2011 | Baker | G06T 5/003 348/296 |
| 2012/0013777 | A1* | 1/2012 | Mao | H01L 27/14621 348/280 |
| 2012/0242874 | A1* | 9/2012 | Noudo | H01L 27/1464 348/294 |
| 2014/0118584 | A1* | 5/2014 | Lee | H04N 5/2254 348/262 |

OTHER PUBLICATIONS

Peter J. W. Noble. "Self-Scanned Silicon Image Detector Arrays", IEEE Transactions on Electron Devices, Apr. 1968, pp. 202-209, vol. ED-15, No. 4.

Xiaoliang GE. "The Design of a Global Shutter CMOS Image Sensor in 110nm Technology", Master of Science Thesis for the degree of Master of Science in Microelectronics at Delft University of Technology, Aug. 21, 2012, 138 pages, Delft, Netherlands.

Stefan Lauxtermann, et al. "Backside Illuminated CMOS Snapshot Shutter Imager on 50um Thick High Resistivity Silicon". Sensor Creations., Inc. (SCI), 6609 Santa Rosa Rd., Camarillo, CA 93012, USA, 4 pages.

\* cited by examiner

3-DIC GLOBAL/ROLLING SHUTTER CMOS IMAGE SENSOR
700

GLOBAL SHUTTER IMAGE SENSOR HAVING EXTREMELY FINE PITCH

BACKGROUND

Recent developments in semiconductor technology include the complementary metal-oxide-semiconductor (CMOS). CMOS is a technology employed in constructing integrated circuits that yields semiconductor devices having a wide variety of uses in electronic components. These uses can include, for instance, microprocessors, microcontrollers, random access memory, storage memory, and other digital logic circuits. Analog uses for CMOS technology include data integrators, and integrated transceivers employed in electronic communication, as well as image sensors for cameras and video recording devices.

One particular type of image sensor leveraging CMOS technology is the CMOS image sensor. Like many CMOS devices, CMOS image sensors are flexible devices that can be integrated with other analog or digital components, or can be incorporated into a System-on-Chip (SoC). In the latter form, an image sensor can be integrated with various other components (e.g., analog, digital, . . . ) associated with capturing or processing an image, on a common integrated circuit chip. For instance, the SoC can comprise a single piece of silicon that includes the image sensor, a microprocessor, microcontroller, or digital signal processor (DSP) core, memory, analog interfaces (e.g., analog to digital converters, digital to analog converters), among other components.

Imaging devices utilizing CMOS imaging sensors can have reduced manufacturing costs, reduced power consumption, or reduced electronic noise, while achieving higher optical resolutions. For instance, cameras can use CMOS imaging System-on-Chip (iSoC) sensors that efficiently marry low-noise image detection with sophisticated signal processing, in conjunction with supporting blocks that can provide timing control, clock drivers, reference voltages, analog to digital conversion, digital to analog conversion and image processing elements. High-performance video cameras can thereby be assembled using a single CMOS integrated circuit supported by few components including a lens and a battery, for instance. Accordingly, by leveraging iSoC sensors, camera size can be decreased and battery life can be increased. The iSoC sensor has also facilitated the advent of more advanced optical recording devices, including dual-use cameras that can alternately produce high-resolution still images or high definition (HD) video.

An image sensor converts an optical image into an electronic signal, which can then be processed and reproduced, for instance on a display screen. Typically, the image sensor comprises an array of many active pixels; each active pixel comprises a CMOS photodetector (e.g., photogate, photoconductor, photodiode, . . . ) controlled by circuits of digitally managed transistors. The CMOS photodetector can absorb electromagnetic radiation in or around the visible spectrum (or more typically a subset of the visible spectrum—such as blue wavelengths, red wavelengths, green wavelengths, etc.), and output an electronic signal proportionate to the electromagnetic energy absorbed.

Electronic imaging devices, such as digital cameras and particularly video recorders, capture and display many optical images per second (e.g., 30 per second, 60 per second, 70 per second, 120 per second, . . . ), equal to the optical frame rate of the imaging device. Capturing a single image in a single frame time involves multiple operations at the CMOS pixel array and readout circuit. One mechanism for image capture is referred to as a rolling shutter. As an example, rolling shutter operations can include capture and convert (e.g., capture light information and convert to electrical information), readout, and reset operations. Some frames can be constructed so that the capture and convert operation, and the reset operation are performed in a single reset cycle, for instance, with reset of a prior frame occurring at a beginning of the reset operation, and capture and convert of a current frame occurring at the end of the reset operation. Thus, alternating reset and readout cycles can clear the CMOS photodetector array, capture a new image, and output the captured image for processing.

Another mechanism for controlling electronic shutter operations for a CMOS image sensor is a global shutter operation. For global shutter operations, all pixels of the CMOS image sensor are reset concurrently. This particular reset is referred to as a global reset. After being reset, the pixels are configured to collect light for an exposure period, (typically having a predetermined duration). Charge is transferred from photodiodes of respective pixels to a floating diffusion node; the transfer of charge can again be performed concurrently for all pixels, referred to as a global transfer.

For certain global shutter pixels, a correlated double sampling (CDS) operation is conducted over multiple frames. To achieve CDS, a floating diffusion node that will ultimately be used to store the signal charge from the photodetector is reset, and a reset voltage is read out (or output) with respect to a reference voltage. This readout is referred to as a "reset frame". A global transfer is performed to transfer charge from the image sensor's photodetectors to a corresponding floating diffusion node of the image sensor. Voltage on the floating diffusion node is read out, again with respect to the same reference voltage. This readout is referred to as a "readout frame". The reset frame subtracted from the readout frame provides the actual image value sans the correlated noise present in each of the two frames. CDS can also be performed entirely within the sensor if there is means for storing the reset frame and subsequently subtracting it from the signal frame.

The global shutter can provide advantages over the rolling shutter operation. For instance, global shutter mitigates or avoids some undesirable artifacts observed in the rolling shutter operation, like geometric deformation of moving objects stemming from the capture of object movement at a rate faster than the frame capture rate. Additionally, global shutter operations need not employ a mechanical shutter to capture still images. However, global shutter does present some challenges, which largely are the focus of ongoing research and development in CMOS image sensor technology.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In various aspects of the present disclosure, there is provided an image sensor having global shutter circuitry and an extremely fine pixel pitch. In some embodiments, average pixel pitch can be below about 2 micrometers (μm). In one or more embodiments, disclosed image sensors combine global shutter circuitry with rolling shutter circuitry for respective subsets of sensor pixels to marry imaging benefits of global shutter circuitry with relatively small circuit overhead of rolling shutter circuitry. Such image sensors can achieve improved optical performance with smaller pixel pitch and optical resolution than existing global shutter image sensors.

In further embodiments, an image sensor can comprise a matrix of optical pixels, including a high luminance subset of pixels, and a low luminance subset of pixels. Global shutter circuitry can be provided for the high luminance pixels to exploit the visual preference of the human eye to achieve enhanced imaging characteristics of the global shutter circuitry. Likewise, rolling shutter circuitry can be provided for the low luminance pixels to reduce total semiconductor area consumed by combined image sensor readout circuitry (e.g., circuitry for high luminance and low luminance pixels). In various embodiments, pixel pitch of high luminance pixels can be greater than 2 µm, whereas pixel pitch of low luminance pixels can be less than 2 µm, providing an average pixel pitch of about 2 µm.

According to one or more additional embodiments, a disclosed image sensor can be constructed from multiple semiconductor wafers bonded together. As one example, an array of photodiodes (e.g., high quality pinned photodiode) can be formed in a first substrate with transfer circuitry and comprising one or more photodiode metal layers above the first substrate. Storage, readout and transfer circuitry associated with the array of photodiodes can be formed in a second substrate, and comprising one or more circuitry metal layers above the second substrate. The first substrate or second substrate can be inverted and the photodiode metal layers bonded to the circuitry metal layers, to secure the array of photodiodes on the first substrate to the associated circuitry on the second substrate. The bonded device can be backside illuminated, with a non-optically sensitive matrix (between respective photodiodes) of the first substrate shielding global shutter circuitry on the second substrate from stray light and therefore limiting parasitic ghost images.

In one or more disclosed embodiments of the subject disclosure, there is provided an image sensor. The image sensor can comprise an array of optically sensitive pixels configured to capture optical information incident upon the array and generate electrical information representative of the optical information. Moreover, the image sensor can comprise array circuitry configured to manage collection and output of the electrical information. In a further embodiment(s), the array of optically sensitive pixels includes a matrix of photodiodes including a set of high luminance photodiodes and a set of low luminance photodiodes. In another embodiment(s), the array circuitry includes global shutter circuitry that operates the high luminance photodiodes according to a global shutter capture process, and rolling shutter circuitry that operates the low luminance photodiodes according to a rolling shutter capture process. In yet another embodiment(s), the electrical information output by the array circuitry comprising global shutter electrical information and rolling shutter electrical information.

According to one or more additional embodiments of the subject disclosure, there is described a method of operating a sensor for an imaging device. The method can comprise: initiate a common exposure time for a first set of photodiodes of a global shutter circuit of the sensor and initiate a sequence of non-concurrent exposure times for a second set of photodiodes of a rolling shutter circuit of the sensor. Moreover, the method can comprise activate a global shutter readout circuit for collecting global shutter image data generated by the first set of photodiodes and activate a rolling shutter readout circuit for collecting rolling shutter image data generated by the second set of photodiodes. Further to the above, the method can comprise: output the global shutter image data and the rolling shutter image data in conjunction with processing and compiling image data that includes the global shutter image data and the rolling shutter image data.

In additional embodiments of the disclosure, there is described an imaging device. The imaging device can comprise a set of lenses configured to receive optical information from an object and focus the optical information to an image of the object and an image sensor. The image sensor can further comprise: an array of photodiodes configured to generate electrical information representative of the image in response to the image being focused at the array of photodiodes and array circuitry that facilitates collection and output of the electrical information for electronic processing. Moreover, the image sensor can further comprise: image processing circuitry configured to process the electrical information into image data representative of the image. In an embodiment(s), a first subset of the array circuitry is configured to operate a first subset of the photodiodes according to a global shutter image capture process. In another embodiment(s), a second subset of the array circuitry is configured to operate a second subset of the photodiodes according to a rolling shutter image capture process.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
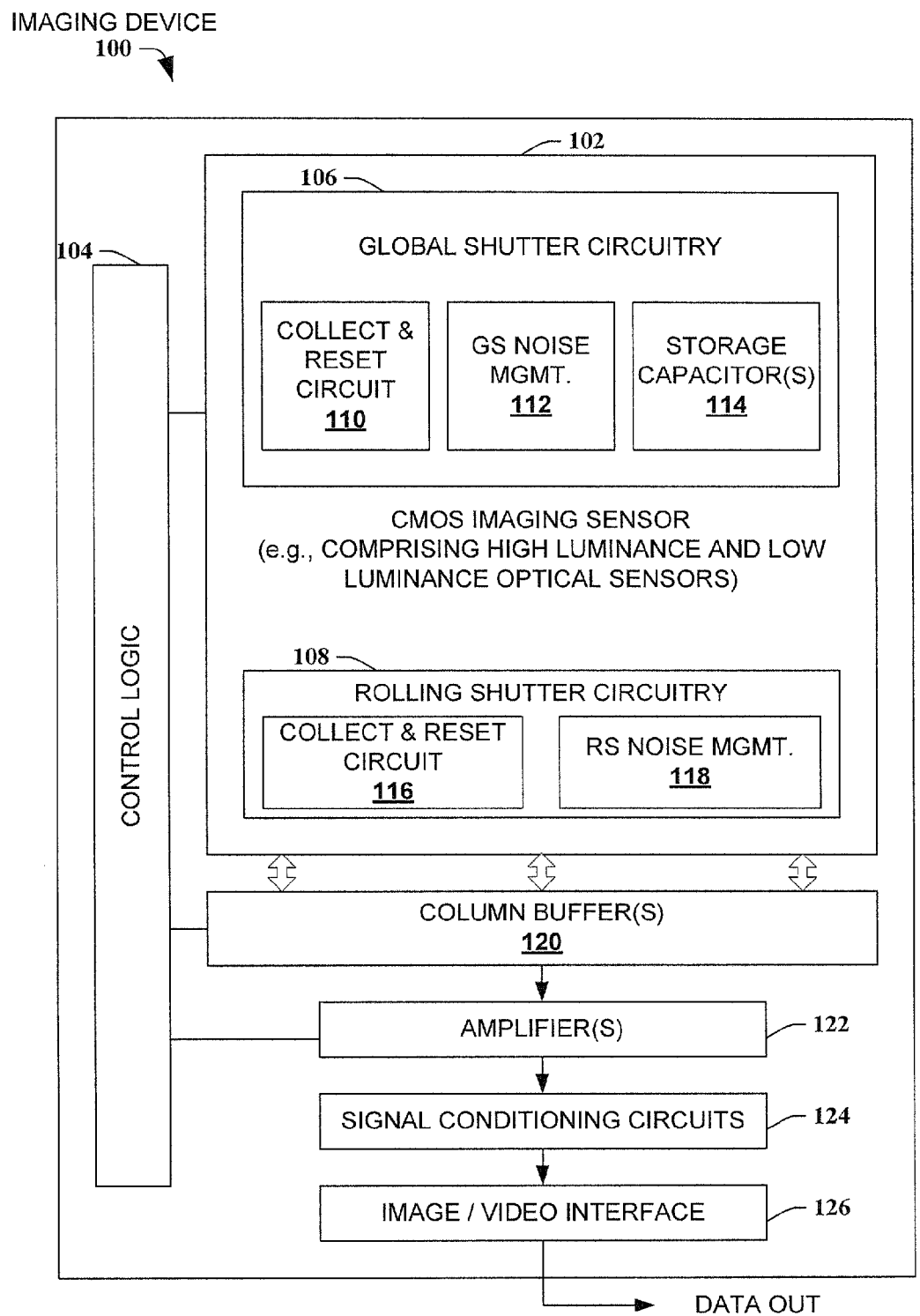
FIG. 1 illustrates a block diagram of an example imaging device comprising global shutter circuitry at fine pitch, in aspects of the disclosure.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

As utilized herein, terms "component," "system," and the like are intended to refer to an electronic or computing entity, either hardware, software (e.g., in execution), or firmware. For example, a component can be one or more semiconductor transistors, an arrangement of semiconductor transistors, a circuit, data transfer or integration circuitry, an electronic clock, a process running on a processor, a processor, an object, a state machine, a computer, etc. By way of illustration, a circuit, a transistor array electrically connected with the circuit, or a controller that manages data flow between the transistor array and the circuit can be a component. Furthermore, an apparatus can comprise one or more components that operate together as a system. For instance, the apparatus can comprise an arrangement of electronic hardware, data transfer circuits, logical control circuits, memory circuits that store processing instructions, and a processing circuit that implements the processing instructions in a manner suitable to perform an electronic or computing task.

Furthermore, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The term "article of manufacture" as used herein is intended to encompass an electronic device, a semiconductor device, a computer, or a computer program accessible from any computer-readable device, carrier, or media. By way of example, and not limitation, computer-readable media can include hardware media, or software media. In addition, the media can include storage media, transport media or communication media. For example, computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include a data transfer bus, a signal interface (e.g., a wireless communication interface), or the like. Of course, those skilled in the art will recognize many modifications can be made to this configuration without departing from the scope or spirit of the disclosed subject matter.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

Various aspects of the subject disclosure provide a high quality global shutter image sensor having relatively fine pitch. In one or more embodiments, the image sensor can comprise respective subsets of high luminance and low luminance pixels. High luminance pixels can be associated with global shutter circuitry to enhance quality of a still image or video, whereas low luminance pixels can be associated with rolling shutter circuitry to reduce average semiconductor area consumed by complementary metal oxide semiconductor (CMOS) circuitry of the image sensor, thereby reducing average pixel pitch of the image sensor.

CMOS image sensors have provided some manufacturing advantages over previous charge-couple device (CCD) image sensors, enabling the expansion of electronic cameras and video cameras to wider, more profitable markets. The CCD image sensor is an analog device that generates electrical charge in response to light incident upon a photo sensor. Charges obtained by a matrix of such sensors are read out and converted to voltages representative of the incident light. CMOS image sensors comprise photo sensors formed by a CMOS semiconductor process (e.g., pinned photodiodes) and associated circuitry that receives electrical information generated by the CMOS image sensors in response to the incident light. As CMOS manufacturing has progressed to smaller technologies and low manufacturing cost, quality of CMOS sensors has improved while cost has decreased significantly. As such, CMOS image sensors dominate the consumer market for optical cameras and video cameras.

CMOS image sensors having the smallest circuitry footprint, and therefore the finest pixel pitch and highest resolution, are rolling shutter image sensors. A photodiode having between 3 and 5 transistors (e.g., 3T, 4T, 5T) per pixel and a source-follower amplifier for pixel readout can achieve high noise reduction and low quality still images, even at high resolutions. To capture an image, an array of rolling shutter photodiodes sequentially resets, exposes, and reads out information from subsets of the rolling shutter photodiodes (e.g., see FIG. 2, infra). However, for high-speed imaging in which an object changes or moves (or light emitted from the object changes), unnatural artifacts can be present in the information read out from the image sensor, distorting a captured image of the object. This can be exacerbated when a camera is moved, or panned during image-capture, or for video-capture of a moving object. In the latter case, artifacts in respective images of capture video often produce wobble effects, distorting the video.

Global shutter is an imaging technology that can mitigate or avoid at least some optical artifacts of rolling shutter technology, producing higher quality images or video. Global shutter, however, can require additional and larger circuit components to capture an image and readout image information, and reduce noise generated by the global shutter capture/readout circuitry. This can significantly increase the area of global shutter pixels, increasing pixel pitch and reducing optical resolution. Accordingly, global shutter image sensors, though of higher quality, tend to have lower resolution. But recently, demand for both high quality and high resolution video has increased, e.g., with high-definition video capture and playback equipment. Various disclosed embodiments meet that demand, providing image sensors with high quality, low noise optical image capture with pixel pitch below 3 µm, in various embodiments. In some embodiments, a disclosed image sensor can achieve an average pixel pitch about 2 µm or less with high luminance v. chrominance output. Accordingly, the disclosed image sensors can provide significant advantages over conventional image sensors.

Referring now to the drawings, FIG. 1 depicts a block diagram of an example imaging device 100 according to one or more embodiments of the present disclosure. Imaging device 100 can be a camera, in some embodiments. In other embodiments, imaging device 100 can be a video recorder. In still other embodiments, imaging device 100 can be a camera/video module that can be integrated as part of another electronic device, such as a cell phone, smartphone, camera, video recorder, laptop computer, tablet computer, and so forth.

Imaging device 100 can comprise a CMOS image sensor 102 comprising an array of optically sensitive pixels. The optically sensitive pixels can be configured to capture optical information incident upon CMOS image sensor 102 and generate electrical information representative of the captured incident optical information. Additionally, a first subset of the pixels can be connected to global shutter circuitry 106 and a second subset of the pixels can be connected to rolling shutter circuitry 108. Operation of CMOS image sensor 102, including the first subset of pixels and global shutter circuitry 106 as well as the second subset of pixels and rolling shutter circuitry 108 can be regulated by control logic 104. Control logic 104 can comprise hardware (e.g., logic gates, power source(s), amplifiers, conductive lines, etc.) or software (e.g., firmware, embedded instructions, logic routines, and so on), or a combination of the foregoing, configured to operate imaging device 100. In various embodiments, control logic 104 can be configured to operate imaging device 100 as a stand-alone optical capture device, or as a module integrated with an electronic device (e.g., video camera, camera, etc.).

In further embodiments, the first subset of pixels connected with global shutter circuitry 106 can comprise high luminance pixels. The high luminance pixels can be green pixels in a RGB color scheme, as one example, or yellow pixels in a CYM color scheme, as another example. Other color schemes can be employed in still other embodiments, where the high luminance pixels are sensitive to colors (e.g., subsets of the optical spectrum) near a peak of the photopic luminosity function of human visual perception. High luminance pixels of image sensor 102 are operated by global shutter circuitry 106 according to a global shutter image capture process (e.g., see FIG. 2, infra). Global shutter circuitry 106 can comprise reset and collection circuit 110, configured to reset high luminance pixels and initiate a new image capture frame. The reset erases electronic signals (e.g., charge, voltage, current, etc.) stored by collection components (e.g., capacitors, etc.) in response to light previously incident upon the high luminance pixels. This reset and erasure of stored electronic signals can persist be for a finite time, called a reset time frame (or reset frame). After the reset frame, an exposure frame begins in which the collection components respectively accumulate electrical information in response to, and in proportion with, incident light captured by respective high luminance pixels. The exposure frame can persist for a finite time, called an exposure time frame (or exposure frame). At the end of the exposure frame a readout frame can begin, in which electrical information stored in the collection components can be transferred to respective storage capacitors 114 associated with the high luminance pixels. Readout of the electrical information can be performed in sequence for subsets of the high luminance pixels on a column buffer(s) 120. Additionally, global shutter circuitry 106 can comprise global shutter noise management circuitry 112, configured to subtract dark noise, fixed pixel noise, and so on, from the stored electrical information prior to or in conjunction with readout on column buffer(s) 120.

In addition to the foregoing, the second subset of pixels connected with rolling shutter circuitry 108 can comprise low luminance pixels. The low luminance pixels can be red and blue pixels in the RGB color scheme, or cyan and magenta pixels in the CYM color scheme, as two examples. For other color schemes, the low luminance pixels can be sensitive to subsets of colors on a downward slope of the photopic luminosity function. Low luminance pixels of image sensor 102 are operated by rolling shutter circuitry 108 according to a rolling shutter image capture process (e.g., see FIG. 2, infra). Rolling shutter circuitry 108 can comprise a RS reset and collection circuit 116, configured to reset respective subsets of the low luminance pixels in sequence. The respective subsets of low luminance pixels have reset frames that are at least in part non-overlapping (although partially overlapping in some, if not all, disclosed embodiments), followed by respective exposure and readout frames that are also partially non-overlapping with exposure and readout frames of other subsets of the low luminance pixels. Rolling shutter circuitry 108 can further comprise rolling shutter noise management circuitry 118, to subtract dark noise, fixed pixel noise, etc., from electrical information stored in response to the exposure frames. During readout frames, subsets of electrical information (minus noise, dark signals, . . . ) are sequentially read out on column buffer(s) 120.

Rolling shutter circuitry 108 can often be implemented with fewer components consuming less silicon space of image sensor 102 compared with global shutter circuitry 106. Accordingly, in various disclosed embodiments, the high luminance pixels of image sensor 102 can have larger surface area (e.g., on silicon) compared with the low luminance pixels of image sensor 102. In some embodiments, a ratio of high luminance pixel area to low luminance pixel area can be proportional to a ratio of semiconductor area consumed by global shutter circuitry 106 and area consumed by rolling shutter circuitry 108, although the subject disclosure is not so limited. For instance, in at least some embodiments, the ratio of high/low luminance pixel area can be non-proportional to the ratio of global shutter/rolling shutter silicon consumption area. But in general, the low luminance pixels can have smaller pixel pitch than global shutter pixels (due to the smaller area profile of rolling shutter circuitry 108), resulting in a lower average pixel pitch for image sensor 102 than would otherwise be achieved for a global shutter image sensor comprising only global shutter pixels. However, because pixels associated with global shutter circuitry 106 are high luminance pixels to which human vision is more sensitive, visual artifacts associated with rolling shutter image sensors can be mitigated by image sensor 102, yielding better visual performance while achieving lower average pixel pitch.

Further to the above, imaging device 100 can comprise a set of amplifiers 122 and signal conditioning circuits 124 for processing electrical information read out on column buffer(s) 120. Amplifiers 122 can include gain amplifiers, and the like, while signal conditioning circuits 124 can include filter circuits, analog to digital converters, digital to analog converters, additional amplifiers, digital logic circuits, and so on, or suitable combinations of the foregoing. In some embodiments, image sensor 100 can comprise an image/video interface 126 for outputting conditioned electrical information representing a captured image to an external device, such as a digital signal processor, a display, a memory for storage, or a computer or other processing device. In at least some embodiments, image/video interface 126 can comprise a graphical display for viewing an image/video on imaging device 100.

Figure 2:
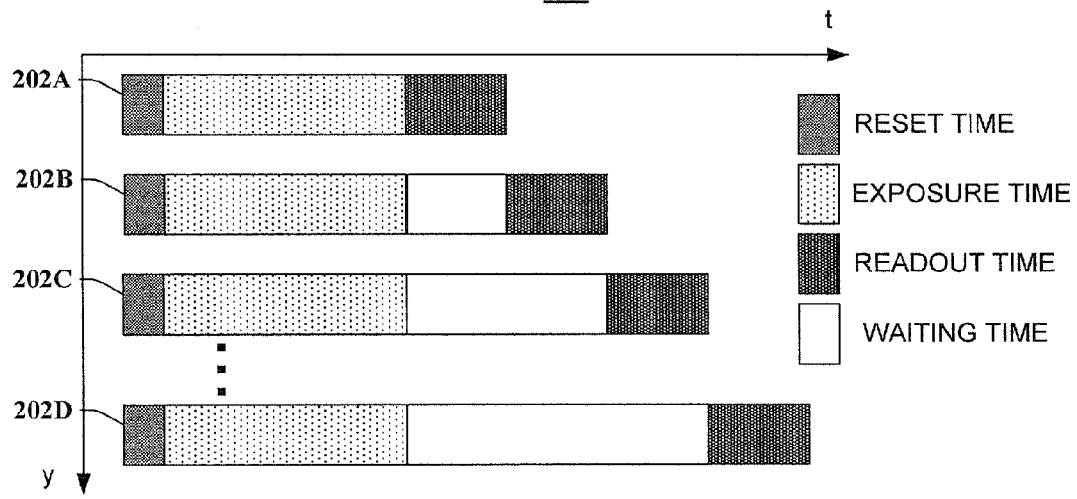
FIG. 2 depicts a diagram of respective global shutter and rolling shutter timing sequences for readout of data from an image sensor, in an aspect.
Figure 2:
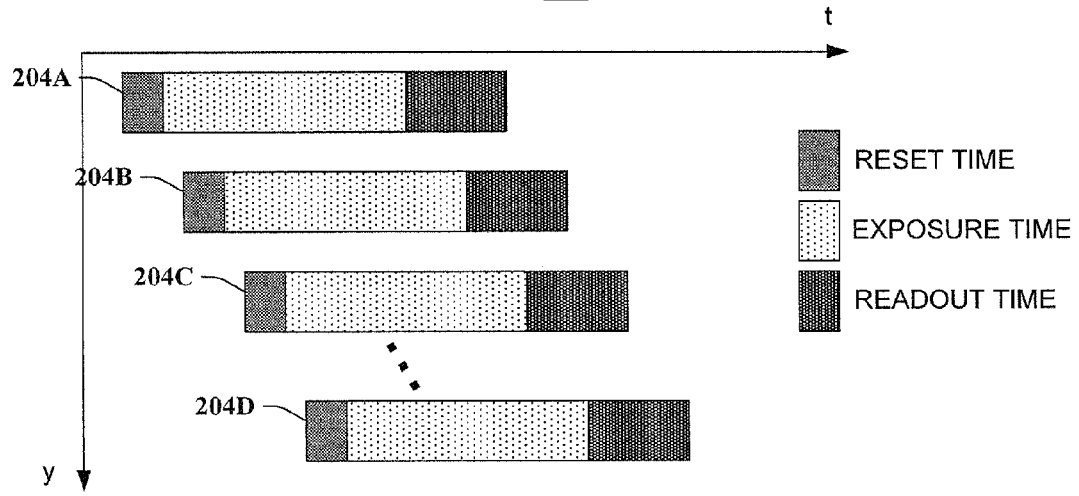

FIG. 2 illustrates diagrams of global shutter and rolling shutter readout sequences, according to further embodiments of the present disclosure. Global shutter sequence 202 is depicted on a graph in which time is represented on a horizontal axis of the graph, and different subsets of global shutter pixels (e.g., high luminance pixels) are listed on a vertical axis of the graph. The respective subsets of global shutter pixels can be respective columns of an array of pixels, rows of the array of pixels, subsets of a column or row (e.g., high luminance pixels within one or more columns, or high luminance pixels within one or more rows, etc.), or the like, or some other suitable arrangement.

Global shutter sequence 202 operates on subsets of global shutter pixels 202A, 202B, 202C, . . . 202D (referred to collectively as global shutter pixels 202A-202D) in the example given at FIG. 2, which can represent any suitable number of subsets of the global shutter pixels. A reset time frame (light shaded rectangle) is initiated for each of the subsets of global shutter pixels concurrently. Following the reset time frame, an exposure time frame (dotted rectangle) is initiated for each of the subsets of global shutter pixels 202A-202D concurrently. Upon completion of the exposure time frame, sequential readout time frames (dark-shaded rectangles) are initiated for respective ones of global shutter pixels 202A-202D. During a readout time frame for subset 202A, subsets 202B, 202C . . . 202D are delayed or paused for respective wait times (of different length). Thus, the readout time frames can be implemented in non-overlapping times in one or more embodiments (or partially over-lapping times, in an alternative embodiment). Once the readout time frame for subset 202A ends, a readout time frame for subset 202B begins, and then for subset 202C, and so on, until subset 202D is read out during a final readout time frame.

By initiating concurrent read time frames and exposure time frames for global shutter sequence 202, each of the subsets of pixels capture light incident upon an image sensor over the same time frame. Accordingly, global shutter sequence 202 can mitigate or avoid optical effects resulting from non-concurrent exposure. For instance, wobble, or 'jello' effects resulting from fast-changing object or light conditions, or panning a camera on moving objects, etc., with rolling shutter systems can be mitigated or avoided by resetting all pixels concurrently, and initiating an exposure time concurrently for all pixels. However, the global shutter operation tends to increase the number, extent and area of CMOS circuitry to support this concurrent reset and exposure time frames. First, an additional transfer node (e.g., transfer capacitor(s) is provided for each pixel in addition to a capture node (e.g., capture capacitor). This enables electrical information captured by a pixel at the capture node, to reside in the transfer node to await a sequential readout time frame for that pixel. Without the transfer node, the pixel would not be able to acquire subsequent information (e.g., take another picture, capture a subsequent object frame, etc.) until readout for the image sensor is complete. Further, global shutter circuitry tends to have additional sources of electronic noise, and therefore utilizes additional noise reduction circuitry, which also adds to global shutter circuitry footprint.

By integrating via the on-chip clocking in the image sensor SoC timing controller an overlap of a first frame's readout frame with the subsequent exposure frame, a non-interrupted sequence of exposure frames is read out from the image sensor. The resulting video, as one example, is consequently equivalent to that produced by a film-based camera wherein exposure frames are sequentially read without interrupting the image stream.

Rolling shutter sequence 204 operates sequentially on respective subsets of rolling shutter pixels (e.g., low luminance pixels) of an image sensor. The subsets of rolling shutter pixels include subsets 204A, 204B, 204C . . . 204D (referred to collectively as 204A-204D), which can comprise any suitable number of such subsets. Similar to subsets of global shutter pixels 202A-202D, rolling shutter pixels 204A-204D can be low luminance pixels on a column of an image sensor, a row of the image sensor, a subset of a column or row, multiple columns or rows, or the like, or a suitable combination of the foregoing.

Rolling shutter sequence 204 initiates a reset time frame for a first subset 204A of rolling shutter pixels. The reset time frame lasts for a finite time, and ends. An exposure time frame for first subset 204A begins after completion of the reset time frame, persists for an exposure time and ends. A readout time frame begins upon completion of the exposure time frame, and persists for a finite time. A second subset 204B of rolling shutter pixels initiates a reset time frame some time following initiation of the reset time frame of first subset 204A. Similarly, second subset 204B initiates an exposure time frame, followed by a readout time frame. Likewise for subsets 204C . . . 204D. Though subsets of readout time frames for respective subsets of 204A-204D can partially overlap, each readout time frame will have a time when its data is sampled and output on a bus, indicated by the vertical dashed lines intersecting respective readout time frames of rolling shutter sequence 204. Accordingly, data captured by respective subsets of rolling shutter pixels can be read out without conflict from other subsets of pixels.

As in the case of the global shutter section, the rolling shutter section produces a non-interrupted sequence of exposure frames from the image sensor. While the frame-based image from the global shutter section is wholly synchronous with respect to the start and stop of exposure for each line of video, the rolling shutter frame image can be configured to match or to overlap the global shutter image. The latter is shown (e.g., see FIG. 2, infra). While the rolling shutter imagery hence inherently has image latency of one line time with respective to each successive line and one frame time across the image sensor, the higher luminance of the synchronous global shutter imagery generates a superior image to the viewer with minimal latency in the luminance signal relative to the prior art.

Figure 3:
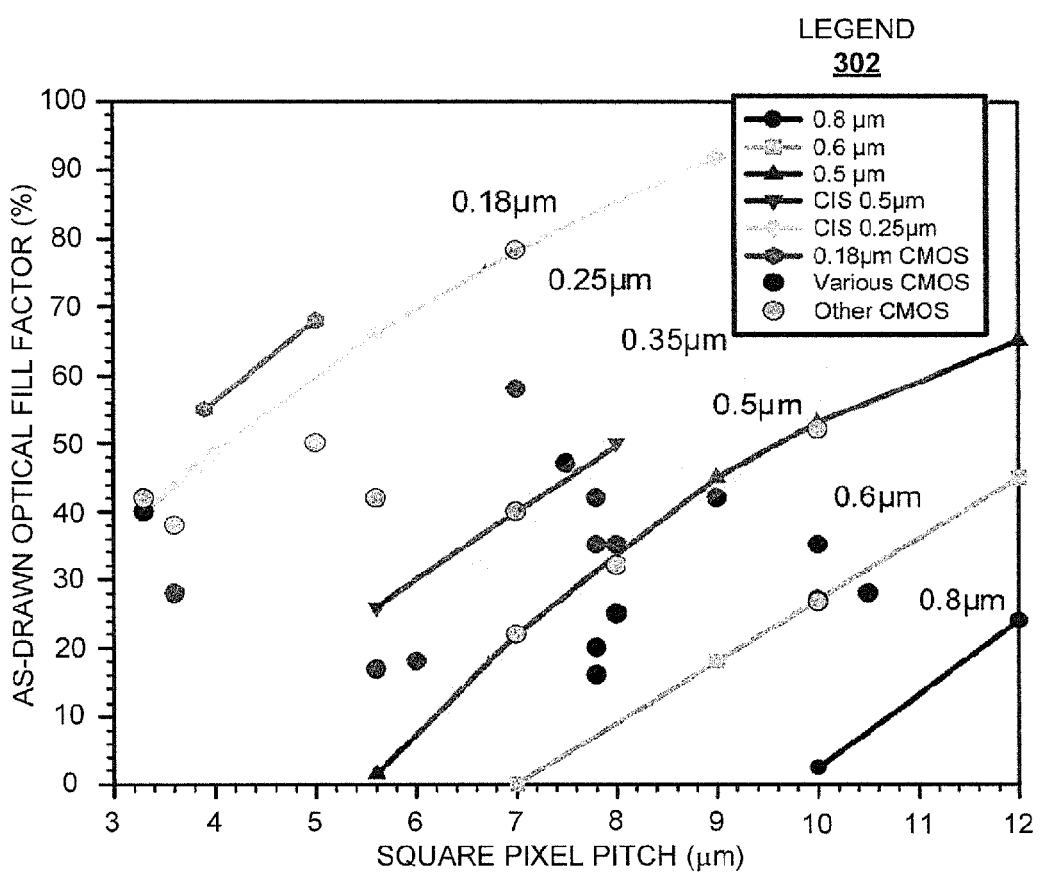
FIG. 3 illustrates a diagram of optical fill factor versus pixel pitch for a complementary metal oxide semiconductor (CMOS) image sensor.

FIG. 3 illustrates a chart 300 of optical fill factor % versus square pixel pitch for a range of CMOS technology nodes. CMOS technologies utilize etching and lithographic equipment having a minimum resolution size, also referred to as a minimum technology node. The minimum technology node is the size of the smallest resolvable feature that can be formed on a substrate with a set of etching/lithographic equipment. Thus, for instance, a 0.8 µm set of equipment can resolvably form (e.g., print, etch, form, deposit, etc.) CMOS features (e.g., metal lines, deposition layers, doping regions, etched lines, etc.) no smaller than 0.8 µm. More advanced etching/lithographic equipment can form smaller features. Thus, chart 300 illustrates optical fill factor v. square pixel pitch for technology nodes ranging from 0.8 µm to 0.18 µm. Particularly, technology node curves are depicted for 0.8 µm (connected dark circles), 0.6 µm (connected light squares), 0.5 µm (connected dark triangles), 0.25 µm (connected light diamonds), and 0.18 µm (connected gray circles) are illustrated. Unconnected dark and gray circles list various other CMOS devices (e.g., independent of technology node size).

Figure 4:
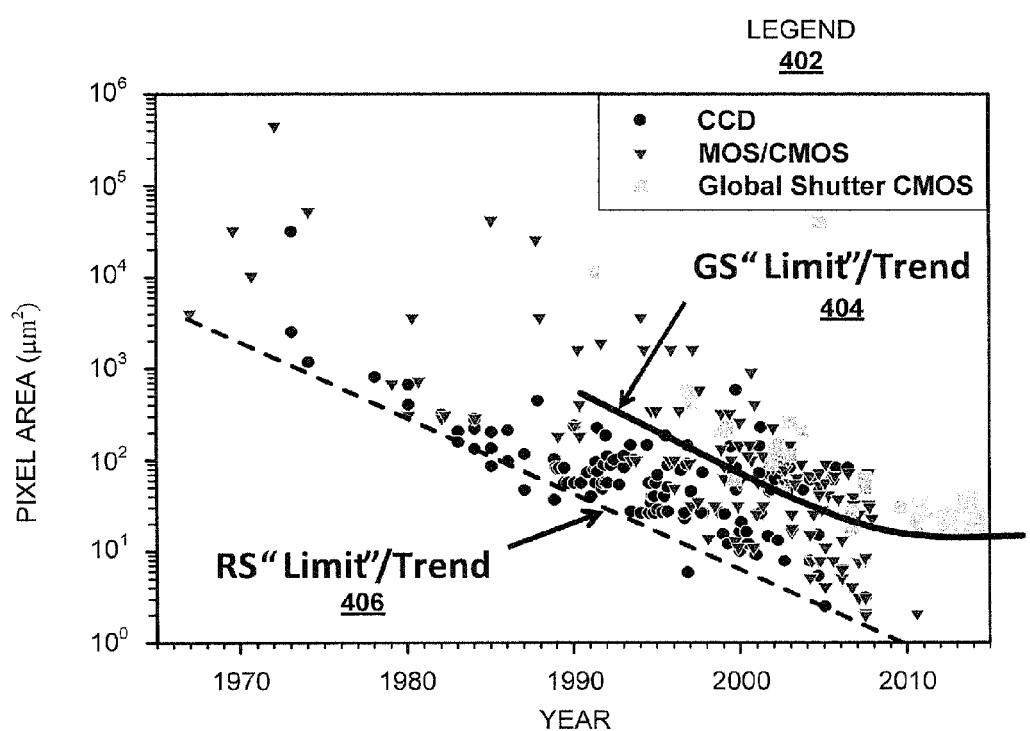
FIG. 4 illustrates a diagram of changing pixel area over time for different CMOS and charge-couple device image sensors.

A general trend illustrated by graph 300 is that as technology node size decreases, optical fill factor % increases for a given square pixel pitch. For instance, an optical fill factor of 50% is first achieved at 0.5 µm technology nodes for square pixel pitch about 10 microns and larger. Likewise, for 0.25 µm technology nodes, optical fill factor of 50% can be achieved at about 4 micron square pixel pitch, and closer to 3 micron square pixel pitch for 0.18 µm technology nodes. Accordingly, more advanced technology nodes and smaller pixel pitch result in higher resolution and higher quality image sensors that can optically support high-speed and high definition image capture. Electronic circuitry to support and readout high definition or high-speed image capture tends to grow in size as quality increases, however, making further reduction in square pixel size challenging to achieve. As illustrated in FIG. 4, infra, multi-decade trends with global shutter pixels and rolling shutter pixels suggest a potential limit on reduction in pixel size. Embodiments of the present disclosure are expected to break through the trend lines for global shutter image sensors.

FIG. 4 depicts a graph 400 of image sensor pixel area (in µm$^2$) versus time (in years) for different technology image sensors. Dark circles indicate CCD sensors, triangles are MOS/CMOS image sensors and gray squares indicate global shutter image sensors. Not surprisingly, as time increases the general trend is a decrease in pixel area for each of the types of image sensors. Graph 400 also shows the bulk of MOS/CMOS pixels and CCD pixels having smaller area than global shutter pixels. One reason for this is that global shutter circuitry has additional sources of noise, requiring additional noise reduction circuitry. A general guideline is that global shutter circuitry consumes at least five times the semiconductor area as rolling shutter circuitry to achieve a similar amount of noise reduction, depending on the specific technology used to integrate capacitors. The generally available capacitor technology available for manufacturing CMOS image sensors more typically requires that global shutter pixels require order of magnitude larger area to achieve similar random noise to a rolling shutter pixel in the same technology node. To date, global shutter pixels have an approximate trend limit 404 having a minimum pixel area as small as about 5 µm$^2$, and rolling shutter trend limit 406 has a minimum pixel area between about 1 and 2 µm$^2$. Accordingly, the disclosed image sensors having global shutter capability with average square pixel area below 3 µm$^2$ and as low as 2 µm$^2$ signifies a significant advancement in image sensor technology.

Figure 5:
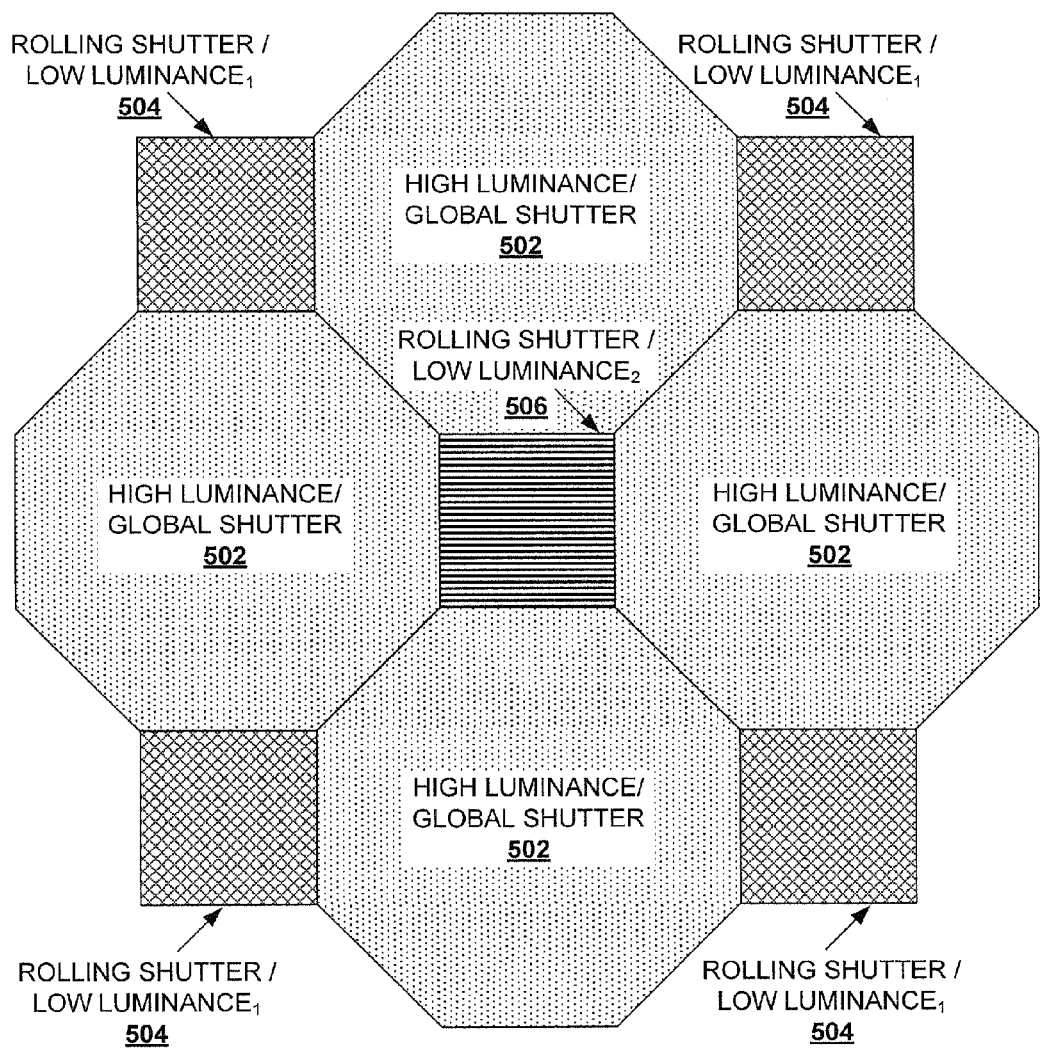
FIG. 5 depicts a diagram of an example pixel matrix having high luminance and low luminance pixels, in a disclosed embodiment.

FIG. 5 illustrates a diagram of an example organizational circuitry layout 500 for image sensor circuitry supporting a combination of rolling shutter and global shutter optical pixels, according to further embodiments of the subject disclosure. Circuitry layout 500 is organized in a manner that segregates rolling shutter circuitry that supports low luminance pixels from global shutter circuitry that supports high luminance pixels. Segregation of global shutter and rolling shutter circuitry can be convenient because of the additional components (e.g., reset noise management, extremely large sample capacitor to preclude generation of reset noise, storage for transferred signals, or the like) and therefore semiconductor space involved with the global shutter circuitry. A high-density circuitry layout can enable smaller pixel areas despite this increased semiconductor space. Circuitry layout 500 provides one such example of high-density semiconductor layout for combined global shutter and rolling shutter circuitry.

Circuitry layout 500 provides interspersed high luminance pixels 502 and low luminance pixels 504, 506, and allocates a larger percentage of semiconductor space for global shutter circuitry supporting the high luminance pixels 502. Particularly, semiconductor space allocated to global shutter circuitry for high luminance pixels 502 is illustrated by shaded octagons. Likewise, the shaded squares illustrate semiconductor space allocated to rolling shutter circuitry for low luminance pixels, including a first set of low luminance pixels, low luminance pixels$_1$ 504 depicted by squares with cross-hatch shading (e.g., red pixels, magenta pixels, etc.) and a second set of low luminance pixels, low luminance pixels$_2$ 506 depicted by the square with horizontal shading (e.g., blue pixels, cyan pixels, or the like). Although circuitry layout 500 depicts a fewer number of the second set of low luminance pixels as compared with the first set of low luminance pixels, this is a geometrical artifact of a subset of a larger semiconductor layout selected for circuitry layout 500. It should be appreciated that circuitry layout 500 as a whole can include a similar (or the same) number of low luminance pixels$_2$ 506 as the number of low luminance pixels$_1$ 504, in various embodiments. The image sensor circuitry is therefore directly compatible for use with standard Bayer-type color filter schemes wherein each Bayer element has two green pixels (luminance) and two chrominance pixels (one red and one green). It is also compatible with alternative Bayer-type configurations using Cyan, Magenta and Yellow color filters.

In the example depicted by FIG. 5, the square regions allocated to rolling shutter circuitry of low luminance pixels$_{1, 2}$ 504, 506 have edges that are (approximately) equal in length to respective octagonal edges of the octagon regions allocated to global shutter circuitry of high luminance pixels 502. This example is intended to serve as an illustration, as other geometric (or quasi-geometric, or non-geometric) layouts can be provided to achieve a high-density circuitry layout that allocates greater semiconductor area (e.g., more than half of available circuitry area) to global shutter circuitry and less semiconductor area (e.g., less than half of the available circuitry area) to rolling shutter circuitry. Other example layouts made known to one of ordinary skill in the art by way of the context provided herein are considered within the scope of the present disclosure.

In one or more embodiments, an image sensor based on circuitry layout 500 can facilitate an average pixel pitch of about 2 µm or below. Because global shutter circuitry is provided with high luminance pixels, visual artifacts associated with rolling shutter circuitry will be mitigated by circuitry layout 500, as such artifacts will be connected with low luminance wavelengths having lower impact on human vision. Accordingly, circuitry layout 500 can simulate the perceived quality of global shutter devices with average pixel pitch (and therefore sensor resolution) beyond that predicted by global shutter trend limit 404 charted at FIG. 4, supra.

In at least one embodiment, an image sensor constructed according to circuitry layout 500 can comprise an array of visible light detectors (e.g., 2500 columns×2000 rows of photodetectors, or some other suitable size array of light detectors). In a further embodiment, active pixels can be spaced about 2 microns center-to-center using 0.18 μm technology node. In at least one embodiment, an optical fill factor equal to or greater than 40% can be achieved for such an image sensor. In a further embodiment, an area allocated for global shutter circuitry of high luminance pixels 502 can be about 50% larger than a second area allocated for rolling shutter circuitry of low luminance pixels 504, 506. In an additional embodiment, the sampling resolution of an image sensor having 50% larger area allocated for global shutter circuitry of high luminance pixels 502 can be the same or substantially the same as an image sensor having uniform pixel area. In addition to the foregoing, luminance signal to noise ratio (SNR) of the image sensor constructed according to circuitry layout 500 can be increased by 3.5 dB over the image sensor having uniform pixel area.

In one or more additional embodiments, each high luminance pixel 502 has semiconductor circuitry in an (approximately) octagonal geometry having effective area of $\sqrt{2}*p^2$, where p is center-to-center distance of two adjacent low luminance pixels 504, 506 (though two low luminance pixels may not actually be adjacent in circuitry layout 500). For instance, the octagonal geometry can have about 40% larger area than the square geometry of the low luminance pixels 504, 506. An aperture of each high luminance pixels 502 determining light collection can be approximated by a circle enclosed within the octagonal area, giving an approximate aperture area of high luminance pixels 502 ($Area_{HL}$) as:

$$Area_{HL} = \pi\left(\frac{p'}{2}\right)^2$$

where p' is a width of the octagonal geometry of high luminance pixels 502. To facilitate larger light collection aperture, the approximate high luminance pixel aperture area can be given as:

$$Area_{HL} = \pi\left(\frac{p'}{2}\right)^2 = \sqrt{2}*p^2$$

with the resulting pitch (or diameter) of the enscribed circle yielding:

$$p' = \sqrt{\frac{4\sqrt{2}}{\pi}}\, p \approx 1.34p$$

For the example given above of average pixel pitch of 2 μm, in at least one embodiment, octagonal areas of high luminance pixels 502 can have pixel pitch of about 2.68 μm and square areas of low luminance pixels 504, 506 can have pixel pitch of about 1.34 μm (square).

In an alternative embodiment, high luminance pixels 502 are provided to achieve about a 1 dB SNR enhancement over an image sensor having uniform pixel size. Achieving 1 dB boost in luminance SNR can be provided, for instance, where high luminance pixels collect (e.g., due to larger aperture size) light over a 12.2% increased surface area compared to uniform pixel aperture size. A target pitch for high luminance pixels 502 in this embodiment can be as follows:

$$p' = \sqrt{\frac{4 \times 1.22}{\pi}}\, p \approx 1.25p$$

In this embodiment, octagonal areas of high luminance pixels 502 can have pixel pitch of (about) 2.5 μm, and square areas of low luminance pixels 504, 506 can have pixel pitch of (about) 1.5 μm.

Micro-lenses and color filters associated with respective high luminance and low luminance pixels can accurately fit over underlying global shutter and rolling shutter circuitry, respectively, supporting each pixel. The pitch of underlying circuitry can therefore vary with different disclosed embodiments. For example, global shutter circuitry can have a pitch of about 2.68 microns in some embodiments, about 2.5 microns in other embodiments, or another suitable pitch in yet other embodiments not specifically delineated herein. Further, rolling shutter circuitry can have a pitch (though not necessarily adjacent) of about 1.32 microns in some embodiments, 1.5 microns in yet other embodiments, and other suitable pitch(es) in embodiments not specified described. Further, these pixel pitch numbers can vary according to color scheme utilized (e.g., RGB, CYM, etc.) in addition to SNR boost, collection efficiency, average pixel size, and so on, or other suitable target capabilities, or a combination of the foregoing.

Figure 6:
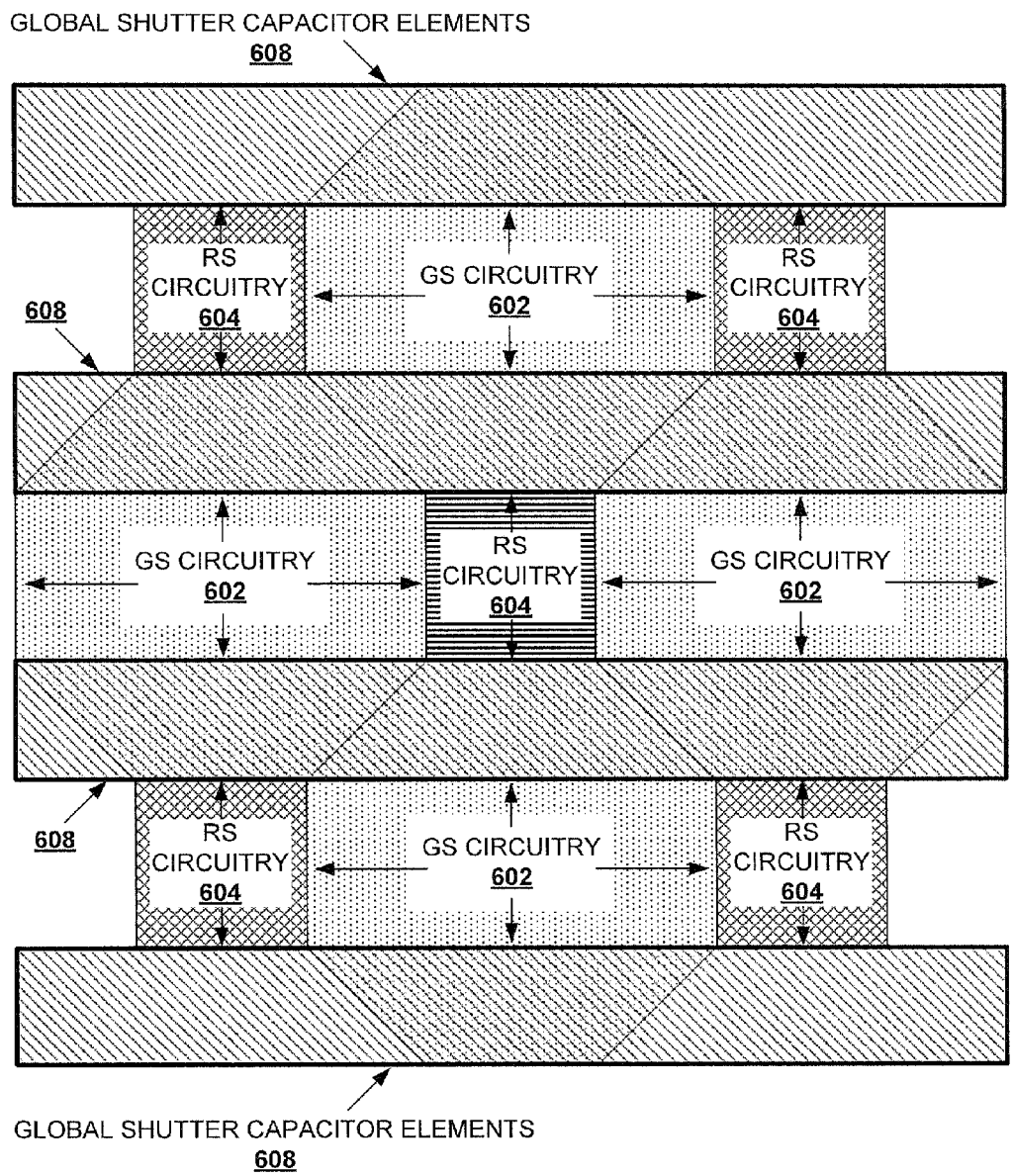
FIG. 6 illustrates a diagram of an example pixel matrix and placement of global shutter capacitors, in further embodiments.

FIG. 6 depicts a block diagram of a circuitry layout 600 for an image sensor according to still other embodiments of the present disclosure. Circuitry layout 600 can have a similar arrangement to circuitry layout 500, in some embodiments. For instance, circuitry layout 600 can allocate a larger percentage of semiconductor area to global shutter circuitry 602 associated with high luminance pixels of the image sensor, and allocate a lesser percentage of the semiconductor area (e.g., less than half of total circuitry area) to rolling shutter circuitry 604 associated with low luminance pixels of the image sensor. Allocation percentages to global shutter circuitry 602 and rolling shutter circuitry 604 can be similar to those described above in circuit layout 500 of FIG. 5, infra, in some embodiments. For instance, similar to that described above, global shutter circuitry 602 can have pitch of about 2.68 microns in some embodiments, or about 2.5 microns in other embodiments, or other suitable pitch. As another example, rolling shutter circuitry 604 can have pitch (though not adjacent) of about 1.32 microns, 1.5 microns, or some other suitable value in various embodiments.

In addition to the foregoing, circuitry layout 600 can designate a subset of semiconductor space allocated to global shutter circuitry 602 to global shutter capacitor elements 608. Global shutter capacitor elements 608 can be arranged, in one embodiment, within the diagonally shaded rectangle regions of adjacent global shutter circuitry 602 areas, and between rows (or columns) of rolling shutter circuitry 604 areas. Accordingly, global shutter capacitor elements 608 can be a subset of global shutter circuitry 602. Other areas of global shutter circuitry 602 outside of global shutter capacitor elements 608 can be allocated for global shutter reset noise management, readout bus, and so forth. Relative size of global shutter capacitor elements 608 to global shutter circuitry 602 areas can be based on design requirements, such as target reset noise. Thus, for instance, where an image sensor has relatively lax reset noise requirements (and smaller capacitance), global shutter capacitor elements 608 can be smaller (e.g., vertically or horizontally) than that depicted by circuitry layout 600, and where image sensor has higher reset noise requirements (and higher capacitance), global shutter capacitor elements 608 can be larger than depicted. In at least some embodiments, global shutter capacitor elements 608 can be non-rectangular, having other geometries, approximately rectangular or approximations of other geometries, or non-geometric shapes, in various embodiments.

The relative size of global shutter capacitor elements 608 can also be based on the limitations of the capacitor fabrication technology. Some processes have significantly lower capacitance density than others. The additional area for elements 608 hence enables the highest possible capacitance for processes having lower density to achieve lower sampling noise than otherwise possible. The additional area for elements 608 further enables extremely high capacitance for processes having higher capacitance density to achieve extremely low noise, even without using the typical reset noise suppression schemes such as correlated double sampling, such that the noise level is equivalent to or better than rolling shutter pixel designs.

Figure 7:
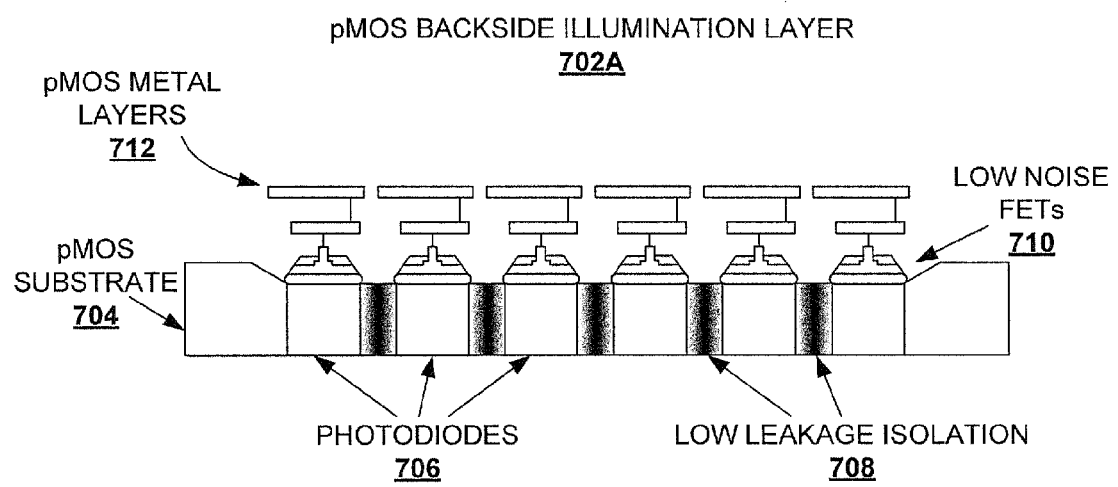
FIG. 7 depicts a diagram of respective layers of a three dimensional integrated circuit (3DIC) image sensor, in an embodiment.
Figure 7:
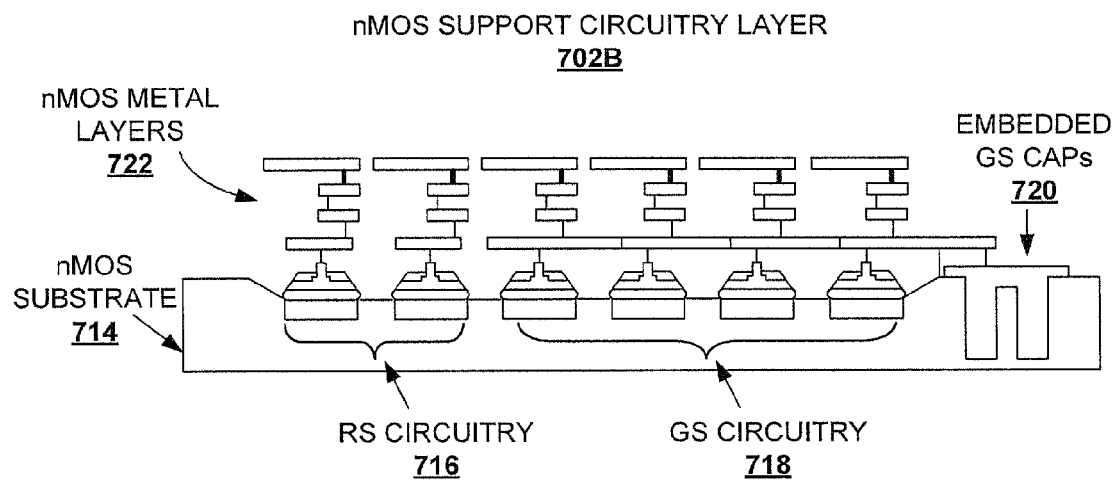

FIG. 7 depicts a diagram of an example three dimensional integrated circuit (3DIC) CMOS image sensor 700, having combined global shutter and rolling shutter circuitry, according to further embodiments. 3DIC CMOS image sensor 700 can comprise multiple layers, including a pMOS backside illumination layer 702A and an nMOS support circuitry layer 702B. pMOS backside illumination layer 702A can comprise a pMOS substrate 704 comprising a matrix of photodiodes 706 and source-follower amplifiers. Manufacturing the photodiodes and amplifier circuits in PMOS can yield a lower noise floor as compared to traditional CMOS sensors (e.g., one or two orders of magnitude lower than CMOS), as well as lower dark current. Although not depicted, an array of micro-lenses can be formed on the bottom side of photodiodes 706 (e.g., see FIG. 8, infra). Furthermore, between photodiodes 706 are low leakage isolation regions 708, which can be p-n junction regions in some embodiments.

Low noise field effect transistors (FETs) 710 can be formed above photodiodes 706. Low noise FETs 710 can be formed utilizing known pMOS fabrication techniques, in some embodiments. Above low noise FETs 710 are a set of pMOS metal layers 712, which can be utilized for management and control circuitry, transport circuitry, or the like.

nMOS circuitry layer 702B can comprise an nMOS substrate 714 having subsets of rolling shutter circuitry 716 and global shutter circuitry 718 formed within nMOS substrate 714. Rolling shutter circuitry 716 and global shutter circuitry 718 can be organized as described herein. For instance, a greater part of a top surface of nMOS substrate 714 can be allocated to global shutter circuitry 718, and a lesser part of the top surface of nMOS substrate 714 can be allocated to rolling shutter circuitry 716. In further embodiments, global shutter circuitry 718 can be formed into a matrix of octagonal or approximately octagonal shapes, and rolling shutter circuitry 716 can be formed into an interspersed matrix of square or approximately square (or rectangular/approximately rectangular) shapes. Global shutter capacitors 720 can be embedded within a subset of nMOS substrate 714 utilizing a deep trench process, or other techniques including MOSFET capacitors produced with thin and high-k dielectrics. In some embodiments, global shutter capacitors 720 can be transfer capacitors (e.g., capacitors utilized to store prior image information before a subsequent reset of photodiode capture circuits) associated with global shutter circuitry 718 and often used to facilitate correlated double sampling. Additionally, nMOS circuitry layer 702B can comprise one or more nMOS metal layers 722 over the rolling shutter circuitry 716 and global shutter circuitry 718 on the top surface of nMOS substrate 714.

Figure 8:
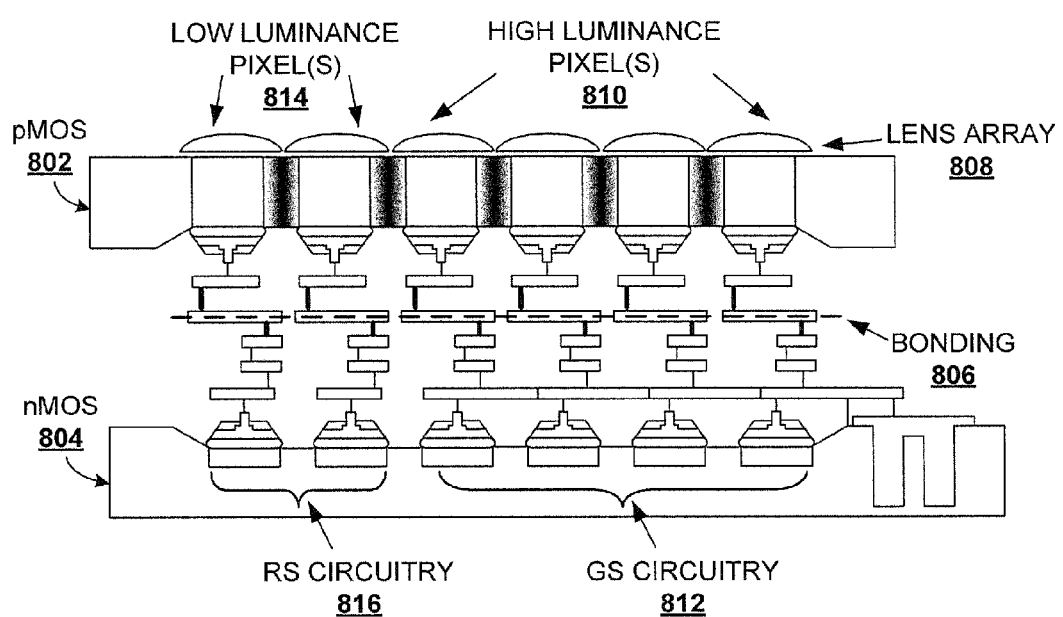
FIG. 8 illustrates a 3DIC with combined rolling/global shutter circuitry having respective layers thereof bonded together, in an embodiment.

FIG. 8 illustrates a block diagram of an example 3DIC CMOS image sensor 800 having combined global shutter and rolling shutter capabilities according to one or more further embodiments of the present disclosure. 3DIC CMOS image sensor 800 comprises a pMOS layer 802 inverted (e.g., with respect to pMOS backside illumination layer 702A of FIG. 7, supra) and bonded to a nMOS layer 804. In some embodiments, pMOS layer 802 can be substantially similar to pMOS backside illumination layer 702A, and nMOS layer 804 can be substantially similar to nMOS support circuitry layer 702B, however the subject disclosure is not limited to these embodiments, and nMOS layer 804 or pMOS layer 802 can vary from the corresponding layers of FIG. 7.

As depicted, 3DIC CMOS image sensor 800 can comprise a bonding 806 to secure pMOS layer 802 to nMOS layer 804. Bonding 806 can comprise a metal to metal bonding, in some embodiments. In other embodiments, bonding 806 can comprise a suitable adhesion material to secure an insulating material (e.g., inter-layer oxide above a set of pMOS metal layers) of pMOS layer 802 to an insulating material (e.g., inter-layer oxide above a set of nMOS metal layers) of nMOS layer 804.

As inverted, pMOS layer 802 is a backside illumination device, in that a top surface (as oriented in FIG. 8) of pMOS layer 802 is the illumination-capture surface of 3DIC CMOS image sensor 800. A lens array 808 is provided over the illumination-capture surface of 3DIC CMOS image sensor 800. Lens array 808 can be configured to focus an image onto optical sensors of pMOS layer 802 and can be provided with a set of color filters (not depicted) that provide color-filtering for color-specific pixels of 3DIC CMOS image sensor 800. Lens array 808 plus the color filters and associated supporting circuitry form a matrix of optically-sensitive pixels of 3DIC CMOS image sensor 800.

Lens array 808 and the supporting circuitry comprise a first subset of pixels that are low luminance pixels 814, and a second subset of pixels that are high luminance pixels 810. High luminance pixels 810 are connected to global shutter circuitry 812, in some embodiments, and low luminance pixels 814 are connected to rolling shutter circuitry 816. As is evident from FIG. 8, global shutter circuitry 812 can be contained substantially within a projected surface area of high luminance pixels 810 onto nMOS layer 804, and rolling shutter circuitry 816 can be contained substantially within a second projected surface area of low luminance pixels 814 onto nMOS layer 804. As is also evident from FIG. 8, the projected surface area in which global shutter circuitry 812 is contained can be larger than the second projected surface area in which rolling shutter circuitry 816 is contained (e.g., see FIGS. 5 and 6, supra). In at least one embodiment, rolling shutter circuitry 816 and global shutter circuitry 812 can output captured data at least in part concurrently, as a whole-image readout process. In other embodiments, rolling shutter circuitry 816 and global shutter circuitry 812 can output captured data sequentially (e.g., first global shutter, then rolling shutter, or the like) or at least in part non-concurrently, to provide rolling shutter image output separate from global shutter image output. In another embodiment, lens array 808 and rolling shutter circuitry 816 and global shutter circuitry 812 can have a pixel pattern as depicted in FIG. 5 or FIG. 6, supra. In other embodiments, lens array 808 and rolling shutter circuitry 816 and global shutter circuitry 812 can have a different pixel pattern, such as a diagonal pattern in which adjacent low luminance— high luminance—low luminance pixels are on a diagonal grid rather than a horizontal grid. For instance, center-to-center positioning of adjacent low luminance—high luminance—low luminance pixel sequences can be located on a diagonal line, rather than a horizontal line as provided in FIG. 5.

The aforementioned diagrams have been described with respect to interaction between several systems, apparatuses, components, electronic circuits, or photodetector arrays. It should be appreciated that such diagrams can include those components or systems specified therein, some of the specified components, or additional components. For example, an imaging device 100 could include 3DIC CMOS image sensor 800 with global shutter circuitry 106 and rolling shutter circuitry 108. Sub-components could also be implemented as architectures electrically connected to other sub-components rather than included within a parent architecture. Additionally, it should be noted that two or more components could be combined into a single component providing aggregate functionality. For instance, signal conditioning circuit(s) 124 can include amplifiers 122 where favorable for circuitry design. Components of the disclosed systems and apparatuses can also interact with one or more other components not specifically described herein but known by those of skill in the art, or made known to one of skill in the art by way of the context provided herein.

Figure 9:
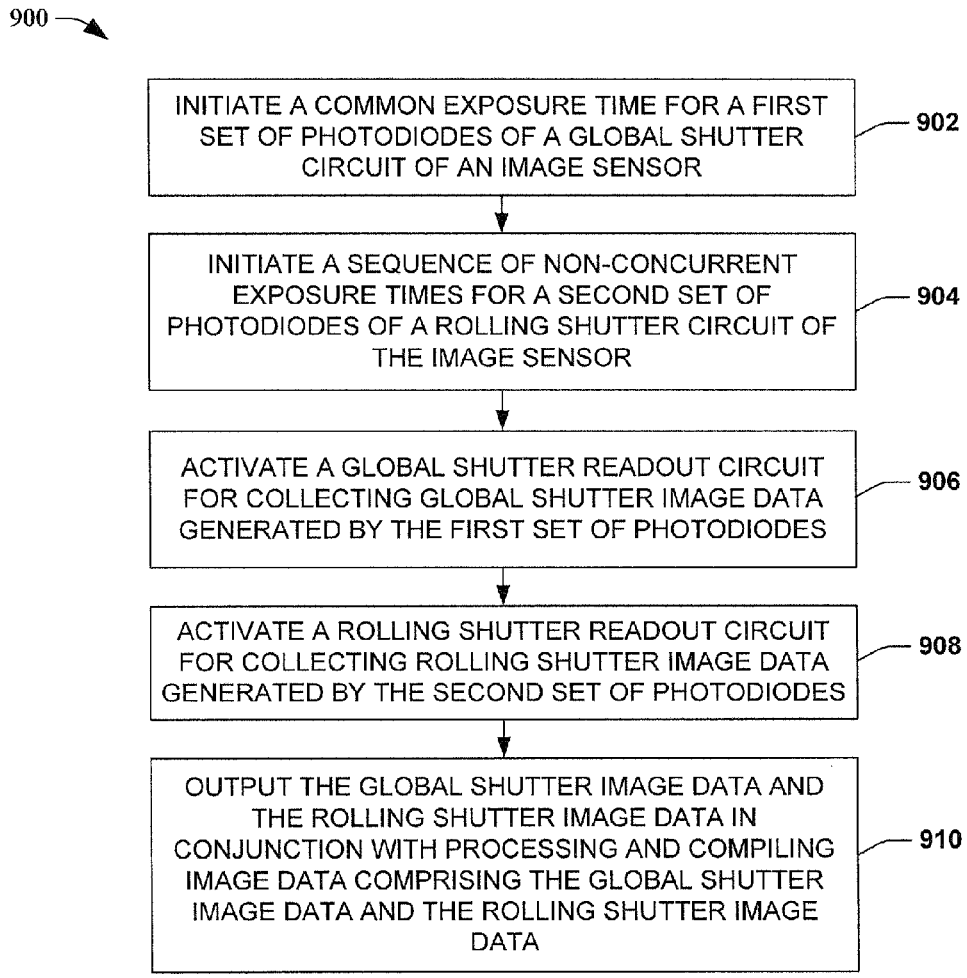
FIG. 9 depicts a flowchart of an example method for operating an image sensor, according to further embodiments of the present disclosure.
Figure 10:
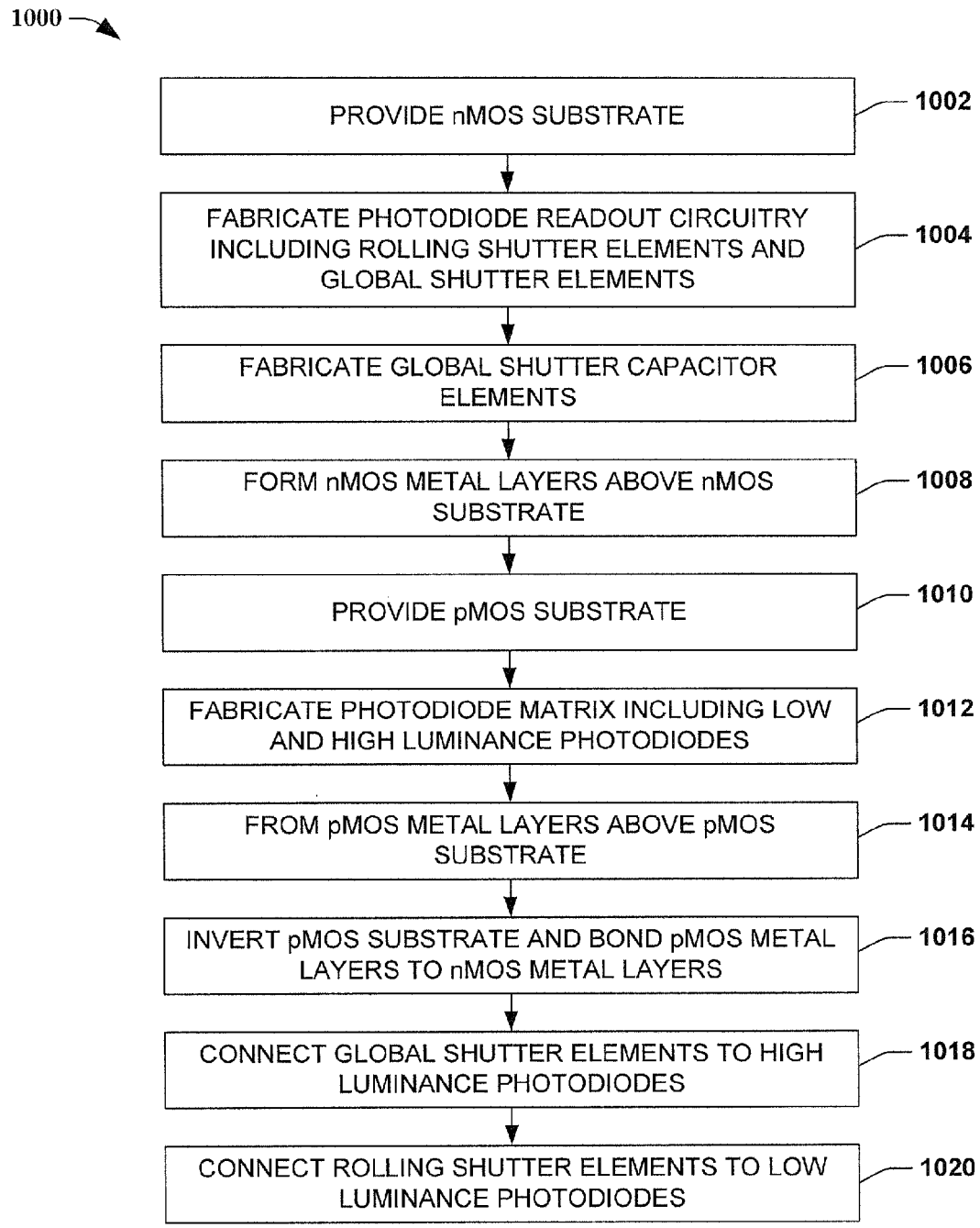
FIG. 10 illustrates a flowchart of a sample method for fabricating an image sensor, according to other embodiments.

In view of the exemplary diagrams described supra, process methods that may be implemented in accordance with the disclosed subject matter will be better appreciated with reference to the flow charts of FIGS. 9 and 10. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter. Additionally, it should be further appreciated that the methods disclosed hereinafter and throughout this specification are capable of being stored on an article of manufacture to facilitate transporting and transferring such methods to an electronic device. The term article of manufacture, as used, is intended to encompass a computer program accessible from any computer-readable device, device in conjunction with a carrier, or storage medium.

FIG. 9 illustrates a flowchart of an example method 900 for operating an image sensor according to further aspects of the present disclosure. At 902, method 900 can comprise initiating a common exposure time for a first set of photodiodes of a global shutter circuit of the image sensor. In various embodiments, initiating the common exposure time can further comprise resetting each of the first set of photodiodes concurrently, and waiting for an exposure time. Waiting for the exposure time can facilitate collection of optical information during the exposure time at an illumination collection circuit.

At 904, method 900 can comprise initiating a sequence of non-concurrent exposure times for a second set of photodiodes of a rolling shutter circuit of the image sensor. In one or more embodiments, initiating the sequence of non-concurrent exposure times for the second set of photodiodes can further comprise activating sequential reset and exposure times for respective subsets of the second set of photodiodes at respective, non-concurrent times. Additionally, the initiating the sequence of non-concurrent exposure times can further comprise waiting for respective exposure times for respective subsets of the second set of photodiodes. Waiting for the respective exposure times can facilitate collection of image information at rolling shutter image capture circuitry associated with respective ones of the respective subsets of the second set of photodiodes.

At 906, method 900 can comprise activating a global shutter readout circuit for collecting global shutter image data generated by the first set of photodiodes. In one or more embodiments, activating the global shutter readout circuit can further comprise transferring electrical signals generated by respective ones of the first set of photodiodes to respective transfer elements, including transistors and capacitors, of the global shutter readout circuit. In at least one embodiment, activating the global shutter readout circuit can further comprise implementing sequential output of respective subsets of global shutter signals from respective subsets of the global shutter transfer capacitors.

At 908, method 900 can comprise activating a rolling shutter readout circuit for collecting rolling shutter image data generated by the second set of photodiodes. For example, activating the rolling shutter readout circuit can further comprise implementing sequential output of respective subsets of rolling shutter signals from the rolling shutter readout circuit. At 910, method 900 can comprise outputting the global shutter image data and the rolling shutter image data in conjunction with processing and compiling image data that includes the global shutter image data and the rolling shutter image data.

FIG. 10 illustrates a flowchart of an example method 1000 for fabricating an image sensor, according to one or more further embodiments of the present disclosure. At 1002, method 1000 can comprise providing an nMOS substrate. At 1004, method 1000 can comprise fabricating photodiode readout circuitry including rolling shutter elements and global shutter elements. At 1006, method 1000 can comprise fabricating global shutter capacitor elements for the image sensor. In an embodiment, fabricating the global shutter capacitor elements can comprise forming deep trench, embedded high density capacitors in the nMOS substrate. In other cases, the high density capacitors can be fabricated in the metal layers between the two substrates or by using MOS capacitors. At 1008, method 1000 can comprise forming nMOS metal layers above the nMOS substrate. The metal layers can be used to form stacked capacitors to either supplement or replace the deep trench capacitors if their capacitance density meets the requirement. At 1010, method 1000 can comprise providing a pMOS substrate. At 1012, method 1000 can comprise fabricating a photodiode matrix including low and high luminance photodiodes. In one embodiment, the photodiode matrix can comprise the low and high luminance photodiodes oriented center-to-center on a vertical-horizontal axis. In another embodiment, the photodiode matrix can comprise the low and high luminance photodiodes oriented center-to-center on a diagonal axis. At 1014, method 1000 can comprise forming pMOS metal layers above the pMOS substrate. At 1016, method 1000 can comprise inverting the pMOS substrate and bonding the pMOS metal layers to the nMOS metal layers. At 1018, method 1000 can comprise connecting global shutter elements to high luminance photodiodes. At 1020, method 1000 can comprise connecting rolling shutter elements to low luminance photodiodes.

Figure 11:
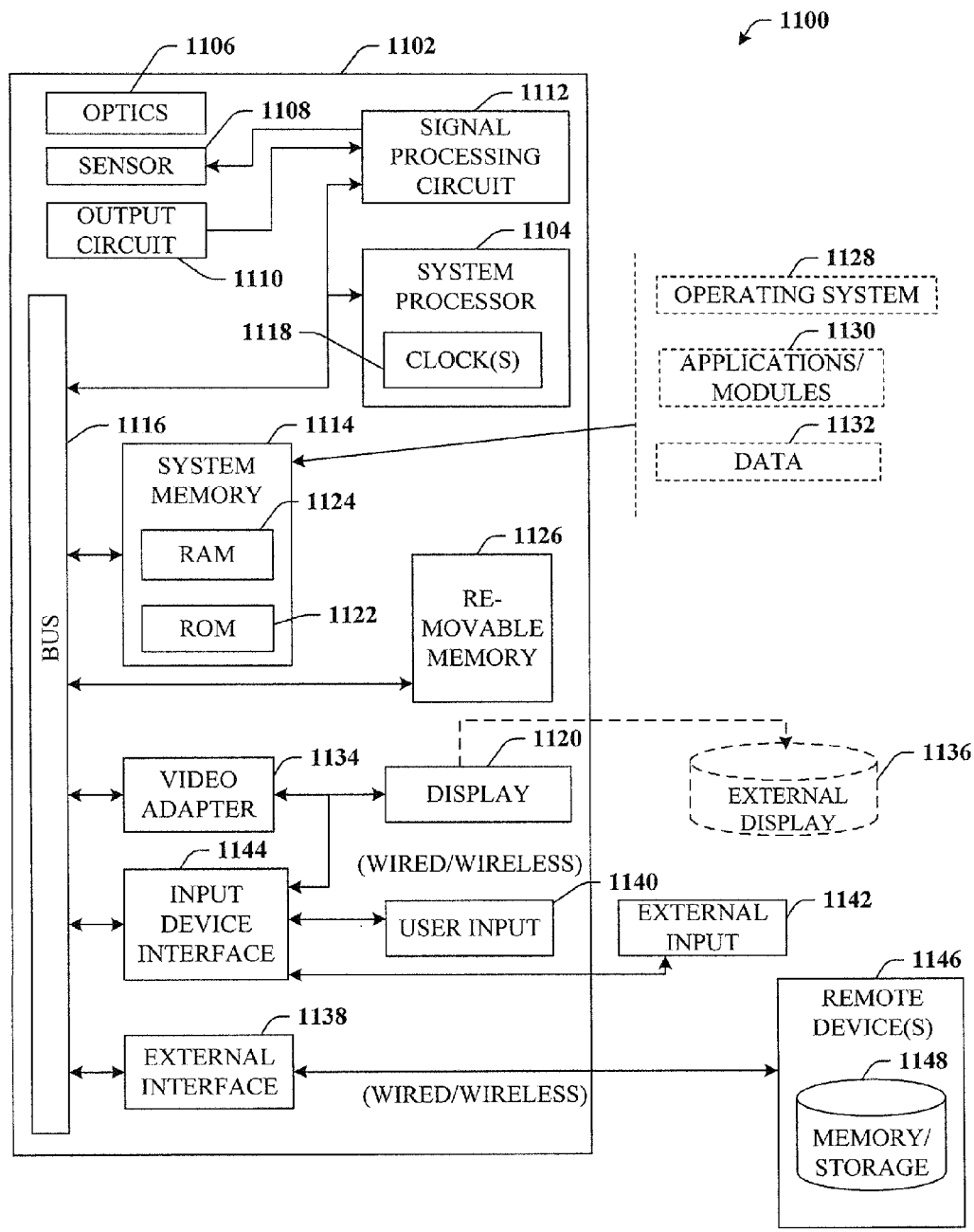
FIG. 11 illustrates a block diagram of an example operating environment for implementing one or more embodiments in an electronic device.

Referring now to FIG. 11, there is illustrated a block diagram of an exemplary digital camera system operable to execute the disclosed architecture. In order to provide additional context for various aspects of the various embodiments, FIG. 11 and the following discussion are intended to provide a brief, general description of a suitable electronic computing environment 1100 in which the various aspects of the various embodiments can be implemented. Additionally, while the various embodiments described above may be suitable for application in the general context of instructions that may run or be executed in conjunction with an electronic device, those skilled in the art will recognize that the various embodiments also can be implemented in combination with other program modules and/or as a combination of hardware and software.

Generally, program modules include routines, programs, components, data structures, etc., that perform particular tasks associated with electronic computing environment 1100. Moreover, those skilled in the art will appreciate that the inventive methods can be practiced with other electronic system configurations, including hand-held computing devices, microprocessor-based or programmable consumer electronics, single-processor or multiprocessor state machines, minicomputers, as well as personal computers, and the like, each of which can be operatively coupled to one or more associated devices.

The illustrated aspects of the various embodiments may also be practiced in distributed computing environments where certain tasks are performed by remote processing devices that are linked through a wired or wireless communications network. In a distributed computing environment, program modules can be located in both local and remote memory storage devices.

An electronic processing device typically includes a variety of computer-readable media. Computer-readable media can be any available media that can be accessed by the electronic processing device and includes both volatile and nonvolatile media, removable and non-removable media. By way of example, and not limitation, computer-readable media can comprise computer storage media and communication media. Computer storage media can include both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, or any other medium which can be used to store the desired information and which can be accessed by the electronic processing device.

Continuing to reference FIG. 11, the exemplary electronic processing environment 1100 for implementing various aspects of one or more of the various embodiments includes a digital camera 1102, the digital camera 1102 including a system processor 1104, optics 1106, an image sensor 1108, an output circuit 1110, a signal processing circuit 1112, a system memory 1114 and a system bus 1116. The system bus 1116 couples to system components including, but not limited to, the system memory 1114 to the system processor 1104. The system processor 1104 can be a suitable semiconductor processing device manufactured for digital camera 1102, or any of various commercially available processors. Dual microprocessors and other multi-processor architectures may also be employed as the system processor 1104.

Optics 1106 can comprise one or more lens elements comprised of refractive material. The refractive material can be suitable to refract electromagnetic radiation, particularly in the visible spectrum, but also the near infrared or ultraviolet spectra, or other suitable spectra. Particularly, optics 1106 can be configured to project and focus an image of an object onto image sensor 1108. Optics can also be configured with an actuator (not depicted) to mechanically adjust optics 1106 to focus objects at varying distances from digital camera 1102.

Image sensor 1108 can comprise any of various sensors for receiving electromagnetic radiation and generating electric signals proportionate to a magnitude of the electromagnetic radiation. For instance, image sensor 1108 can comprise a video tube, a charge-coupled device, or a CMOS device, or the like, or an array of such devices. In a particular example, image sensor 1108 can comprise an array of photodetectors as described herein (e.g., CMOS imaging sensor 106, 3DIC CMOS image sensor 800, etc.). Electric signals generated by image sensor 1108 can be transferred to output circuit 1110, in response to a clock signal generated by an electronic clock(s) 1118 managed by system processor 1104. The electric signals can then be output to signal processing circuit 1112 for image processing.

Signal processing circuit 1112 can be any suitable hardware or software processing entity, including an integrated circuit(s), an application specific integrated circuit(s) (ASIC), a state machine, or other suitable signal processing device. Signal processing circuit 1112 can be configured to perform operations on electric signals provided by output circuit 1110. These operations can include correlated double sampling, gamma processing, analog to digital conversion, gain adjustment, interpolation, compression, or a combination thereof or of the like, to generate digital data to be adapted for presentation on an electronic display 1120 of digital camera 1102. Additionally, signal processing circuit 1112 can store the digital data in system memory 1114 before, during and after the operations.

The system bus 1116 can be any of several types of bus structure suitable for communicatively connecting components of digital camera 1102. System bus 1116 can further interconnect to a memory bus (with or without a memory controller), a peripheral bus, and a local bus using any of a variety of commercially available bus architectures. The system memory 1114 can include read-only memory (ROM) 1122 and random access memory (RAM) 1124. A basic input/output system (BIOS) for digital camera 1002 can be stored in a non-volatile memory (e.g., ROM 1020) such as ROM, EPROM, EEPROM, which BIOS contains the basic routines that help to transfer information between elements within the digital camera 1102, when powered on for instance. The RAM 1124 can also include a high-speed RAM such as static RAM for caching data. Furthermore, digital camera can include removable memory 1126, which can include any suitable non-volatile memory (e.g., Flash memory), or other removable memory technology.

A number of program modules can be stored in the system memory 1114, including an operating system 1128, one or more application programs or program modules 1130 and program data 1132. All or portions of the operating system, applications, modules, and/or data can also be cached in the RAM 1124. It is appreciated that the various embodiments can be implemented with various commercially available or proprietary operating systems or combinations of operating systems.

A display 1120 is also connected to the system bus 1116 via an interface, such as a video adapter 1134. Display 1120 can comprise a flat panel display, such as a liquid crystal display, a light-emitting diode display, or the like. System processor 1104 can control output of image data to present a digital replica of the image received by image sensor 1108 on display 1120. In addition, digital camera 1102 can output the image data to an external display 1136 via a suitable external interface 1138.

A user can enter commands and information into the digital camera 1102 through one or more input devices, e.g., touch screen buttons, switches, dials, levers, etc. For instance, zoom functionality is often implemented by pressing a button, dial, lever, etc., in one direction to zoom in, or another direction to zoom out. Further, display options, selection of images, and similar display commands can be input via a touch screen, often implemented as part of display 1120. Other input devices (not shown) may include a microphone, an IR remote control, a joystick, a game pad, a stylus pen, or the like. These and other input devices are often connected to the system processor 1104 through an input device interface 1144 that is coupled to the system bus 1116, but can be connected by other interfaces, such as a parallel port, an IEEE1394 serial port, a game port, a USB port, an IR interface, a Bluetooth interface, etc.

The external interface 1138 can include at least one or both of Universal Serial Bus (USB) and IEEE1394 interface technologies. Other external connection technologies are within contemplation of the subject matter claimed herein. Moreover, external interface 1138 can include a wireless technology, such as a Wi-Fi communication technology, Bluetooth™ technology, infrared (IR) technology, cellular technology, or the like. In addition to an external display, external interface 1138 can facilitate communicatively coupling digital camera 1102 to one or more remote devices 1146. Remote device(s) 1146 can include a computer, a display, a memory or storage device 1148, and so on. Moreover, commands can be given to digital camera 1102 from remote device(s) 1146 over external interface 1138 to system processor 1104. This can facilitate remote control of digital camera 1102, for remote camera operation (e.g., taking pictures, adding or deleting pictures from system memory 1114, etc.), transferring data, such as stored digital images, updating operating system 1128, applications/program modules 1130, or data 1132, and so on.

The digital camera 1102 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth wireless technologies. Thus, the communication can be a predefined structure as with a conventional network or simply an ad hoc communication between at least two devices.

Wi-Fi, or Wireless Fidelity, allows connection to the Internet from various locations within range of a WiFi access point, without wires. Wi-Fi is a wireless technology similar to that used in a cell phone that enables such devices, e.g., computers, to send and receive data indoors and out; within the range of the access point. Wi-Fi networks use radio technologies called IEEE802.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

Other than in the operating examples, or where otherwise indicated, all numbers, values and/or expressions used in the specification and claims are to be understood as modified in all instances by the term "about."

What has been described above includes examples of the various embodiments. It is, of course, not possible to describe every conceivable combination of components or methods for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. An image sensor, comprising:
   an array of optically sensitive pixels configured to capture optical information incident upon the array and generate electrical information representative of the optical information; and
   array circuitry formed at least in part overlying a substrate and configured to manage collection and output of the electrical information, wherein:
   the array of optically sensitive pixels comprises a matrix of photodiodes comprising a set of high luminance photodiodes and a set of low luminance photodiodes,
   the array circuitry comprises global shutter circuitry that operates the high luminance photodiodes according to a global shutter capture process, and rolling shutter circuitry that operates the low luminance photodiodes according to a rolling shutter capture process, and
   the electrical information output by the array circuitry comprises global shutter electrical information and rolling shutter electrical information, wherein:
   the set of high luminance photodiodes consumes a first surface area of the array of optically sensitive pixels that is larger than a second surface area of the array of optically sensitive pixels consumed by the set of low luminance photodiodes,
   the first surface area maps to a first projected substrate area on a surface of the substrate and the second surface area maps to a second projected substrate area on the surface of the substrate, the first projected substrate area being larger than the second projected substrate area, and
   the global shutter circuitry is contained substantially within the first projected substrate area, and the rolling shutter circuitry is contained substantially within the second projected substrate area.

2. The image sensor of claim 1, the array of optically sensitive pixels having an average pixel pitch no greater than about 2 micrometers (μm).

3. The image sensor of claim 2, wherein a first pixel associated with a high luminance photodiode and associated subset of the global shutter circuitry is greater than 2 μm, and a second pixel associated with a low luminance photodiode and associated subset of the rolling shutter circuitry is less than 2 μm.

4. The image sensor of claim 1, wherein:
the matrix of photodiodes is comprised in a PMOS substrate layer comprising photodiode metal layers fabricated above the PMOS substrate layer;
the array circuitry is comprised in a CMOS substrate layer comprising circuitry metal layers fabricated above the CMOS substrate layer; and
the PMOS substrate layer is substantially inverted with respect to the CMOS substrate layer and one of the photodiode metal layers is bonded to one of the circuitry metal layers to secure the PMOS substrate layer to the CMOS substrate layer.

5. The image sensor of claim 4, wherein the set of high luminance photodiodes is connected to the global shutter circuitry and the set of low luminance photodiodes is connected to the rolling shutter circuitry.

6. The image sensor of claim 1, further comprising a high luminance photodiode of the set of high luminance photodiodes connected to an associated subset of the global shutter circuitry, which is comprised in a portion of the first projected substrate area of the array circuitry that is octagonal or substantially octagonal in shape.

7. The image sensor of claim 6, further comprising a low luminance photodiode of the set of low luminance photodiodes connected to an associated subset of the rolling shutter circuitry, which is comprised in a second portion of the second projected substrate area of the array circuitry and having a square or substantially square shape, wherein the square or substantially square shape comprising the subset of the rolling shutter circuitry shares a common edge with the octagonal or substantially octagonal shape comprising the subset of the global shutter circuitry.

8. The image sensor of claim 1, wherein the global shutter circuitry comprises two global shutter capacitors per respective ones of the set of high luminance photodiodes.

9. The image sensor of claim 1, wherein the rolling shutter circuitry comprises one rolling shutter capacitor per respective ones of the set of low luminance photodiodes.

10. An imaging device, comprising:
a set of lenses configured to receive optical information from an object and focus the optical information to an image of the object; and
an image sensor, comprising:
an array of photodiodes configured to generate electrical information representative of the image in response to the image being focused at the array of photodiodes;
array circuitry that facilitates collection and output of the electrical information for electronic processing; and
image processing circuitry configured to process the electrical information into image data representative of the image, wherein:
a first subset of the array circuitry is configured to operate a first subset of the photodiodes according to a global shutter image capture process, the first subset of the array circuitry being arranged within a footprint of the first subset of the photodiodes, and
a second subset of the array circuitry is configured to operate a second subset of the photodiodes according to a rolling shutter image capture process, the second subset of the array circuitry being arranged within a second footprint of the second subset of the photodiodes, wherein the footprint and the first subset of the array circuitry consume a larger area than the second footprint and the second subset of the array circuitry.

11. The imaging device of claim 10, wherein the first subset of the array circuitry comprises at least two global shutter capacitors per photodiode of the first subset of the photodiodes, and the second subset of the array circuitry comprises fewer than two rolling shutter capacitors per photodiode of the second subset of the photodiodes.

12. The imaging device of claim 10, wherein the first subset of the array circuitry and the first subset of the photodiodes consume more than half of a surface area of a first semiconductor substrate layer utilized by the array of photodiodes and the array circuitry.

13. The imaging device of claim 10, wherein the first subset of the photodiodes are associated with relatively high luminance pixels of the image sensor, and the second subset of the photodiodes are associated with relatively low luminance pixels of the image sensor.

14. The imaging device of claim 13, wherein the first subset of the photodiodes and first subset of the array circuitry correspond with green pixels of a RGB Bayer color pattern, or yellow pixels of a cyan, magenta, yellow (CMY) color pattern, and the second subset of the photodiodes and second subset of the array circuitry correspond with both blue and red pixels of the RGB Bayer color pattern, or both cyan and magenta pixels of the CMY color pattern.

15. The imaging device of claim 14, wherein:
the first subset of array circuitry comprises global shutter capacitors and global shutter circuit elements for the first subset of photodiodes;
one of the first subset of the photodiodes and associated portion of the global shutter circuit elements is formed into an octagonal shape or substantially octagonal shape on the surface area of the semiconductor substrate layer; and
the second subset of array circuitry comprises rolling shutter capacitors and rolling shutter circuit elements for the second subset of photodiodes.

16. The imaging device of claim 15, wherein one of the second subset of the photodiodes and associated portion of the rolling shutter circuit elements is formed into a square shape or a substantially square shape on the surface area of the semiconductor substrate layer, and further wherein the square shape or the substantially square shape comprises a shared edge with the octagonal shape or substantially octagonal shape.

17. The imaging device of claim 12, further comprising a second semiconductor substrate layer, rotated approximately one hundred eighty degrees with respect to the first semiconductor substrate layer and bonded to a metal layer or a dielectric layer formed above the first semiconductor substrate layer, the second semiconductor substrate layer comprising a PMOS substrate and the semiconductor substrate layer comprising a CMOS substrate.

18. The image sensor of claim 1, wherein an average pixel pitch of the high luminance photodiodes and of the low luminance photodiodes are independently about 2 μm or below.

19. The image sensor of claim 1, wherein a first pixel pitch of the set of high luminance photodiodes is about 2.68 μm and a second pixel pitch of the set of low luminance photodiodes is about 1.32 μm or a first pixel pitch of the set of high luminance photodiodes is about 2.5 μm and a second pixel pitch of the set of low luminance photodiodes is about 1.5 μm.

20. The imaging device of claim 10, wherein an average pixel pitch of the high luminance photodiodes and of the low luminance photodiodes are independently about 2 μm or below.

* * * * *